(12) United States Patent
Su et al.

(10) Patent No.: US 9,209,344 B2
(45) Date of Patent: Dec. 8, 2015

(54) METHOD FOR FORMING DOPING REGION AND METHOD FOR FORMING MOS

(71) Applicant: UNITED MICROELECTRONICS CORP., Hsin-Chu (TW)

(72) Inventors: Hao Su, Singapore (SG); Hang Hu, Singapore (SG); Hong Liao, Singapore (SG)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 253 days.

(21) Appl. No.: 13/647,344

(22) Filed: Oct. 8, 2012

(65) Prior Publication Data

US 2014/0099751 A1  Apr. 10, 2014

(51) Int. Cl.
 H01L 21/00 (2006.01)
 H01L 31/18 (2006.01)
 H01L 29/66 (2006.01)
 H01L 29/78 (2006.01)

(52) U.S. Cl.
 CPC ........ H01L 31/1804 (2013.01); H01L 29/6659 (2013.01); H01L 29/7833 (2013.01); Y02E 10/547 (2013.01)

(58) Field of Classification Search
 USPC .................. 438/491, 532, 564; 257/E21.197, 257/E21.316
 See application file for complete search history.

(56) References Cited

U.S. PATENT DOCUMENTS

| 4,176,003 A | 11/1979 | Brower | |
|---|---|---|---|
| 6,566,210 B2* | 5/2003 | Ajmera et al. | 438/303 |
| 2002/0177284 A1* | 11/2002 | Huang | 438/303 |
| 2004/0043549 A1* | 3/2004 | Sayama et al. | 438/197 |
| 2004/0166616 A1* | 8/2004 | Lee et al. | 438/197 |

OTHER PUBLICATIONS

Rucker, Nonequilibrium point defects and dopant diffusion in carbon-rich silicon, Jul. 30, 2001, Physical Review B, vol. 64, 073202.
Ahn, Reduction of Lateral Phosphorus Diffusion in CMOS n-Wells, Mar. 1990, IEEE Transactions on Electron Devices, vol. 37. No. 3.

* cited by examiner

*Primary Examiner* — Daniel Whalen
(74) *Attorney, Agent, or Firm* — Winston Hsu; Scott Margo

(57) ABSTRACT

The present invention provides a method of forming a doping region. A substrate is provided, and a poly-silicon layer is formed on the substrate. A silicon oxide layer is formed on the poly-silicon layer. An implant process is performed to form a doping region in the poly-silicon layer. The present invention further provides a method for forming a MOS.

10 Claims, 6 Drawing Sheets

METHOD FOR FORMING DOPING REGION AND METHOD FOR FORMING MOS

BACKGROUND OF THE INVENTION

1. Field of the Invention

The present invention relates to a method for forming a doping region, and more particularly, to a method for forming a doping region in a silicon-containing layer.

2. Description of the Prior Art

In modern society, the micro-processor system comprised of integrated circuits (IC) is a ubiquitous device, being utilized in such diverse fields as automatic control electronics, mobile communication devices and personal computers. With the development of technology and the increasingly imaginative applications of electrical products, the IC device is becoming smaller, more delicate and more diversified.

In current semiconductor technology, it is conventional to form a doping region in a silicon-containing layer to change its conductivity in this region. However, current technology for forming the doping region is often influenced by temperature or other parameters, and therefore the area of the doping region is hard to control. For example, a phenomenon called "lateral diffusion" is easy to occur, and it makes the area of the doping region becoming greater than what is expected. As the shrinkage of device size, the performance of the devices becomes worse because of the above-mentioned problem, which is a problem needed to be solved.

SUMMARY OF THE INVENTION

The present invention therefore provides a method for forming a doping region in order to solve the above-mentioned problem.

According to one embodiment, a method of forming a doping region is provided. A substrate is provided, and a poly-silicon layer is formed on the substrate. A silicon oxide layer is formed on the poly-silicon layer. An implant process is performed to form a doping region in the poly-silicon layer.

According to one embodiment, a method of forming a doping region is provided. A substrate is provided. A silicon oxide layer is formed on the silicon-containing layer. A doping region is formed in the silicon-containing layer under the silicon oxide layer.

According to another embodiment, a method for forming a MOS is provided. A substrate and a poly-silicon layer are formed on the substrate. A first silicon oxide layer is formed on the poly-silicon layer. The poly-silicon layer is patterned. After forming the first silicon oxide layer, a doping region is formed in the poly-silicon layer under the first silicon oxide layer. A second silicon oxide layer is formed in the substrate at two sides of the poly-silicon layer. After forming the second silicon oxide layer, a source/drain region is formed in the substrate under the second silicon oxide layer.

In summary, the present invention provides a method for forming a doping region in a silicon containing layer, especially a poly-silicon layer to avoid the lateral diffusion of the doping region. The performance of the devices can therefore be improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
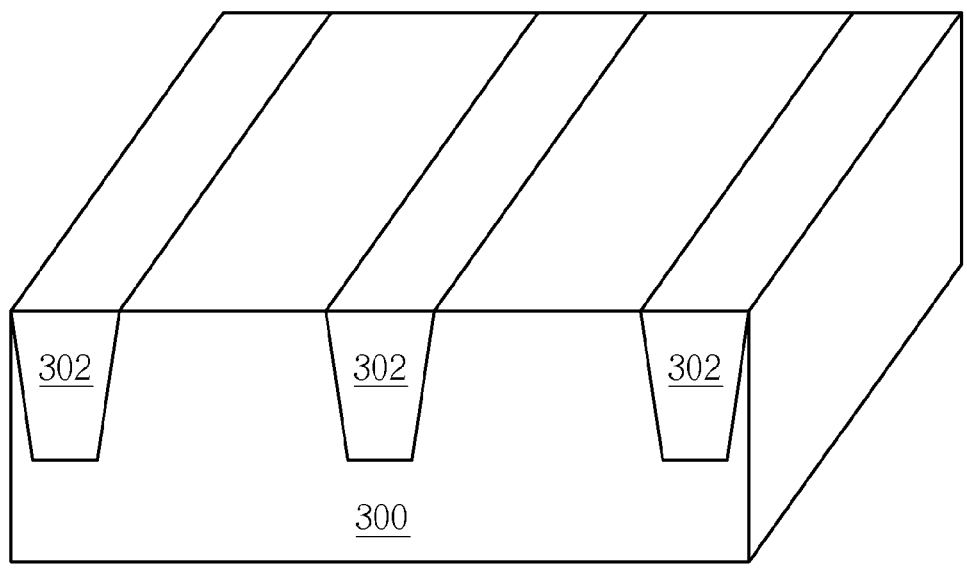
FIG. 1 to FIG. 10 are schematic diagrams of the method for forming a doping region according to one embodiment of the present invention.

Please refer to FIG. 1 to FIG. 10, which are schematic diagrams of the method for forming a doping region according to one embodiment of the present invention. As shown in FIG. 1, a substrate 300 is provided, such as a silicon substrate, an epitaxial silicon substrate, a silicon germanium substrate, a silicon carbide substrate or a silicon-on-insulator (SOI) substrate. Next, a plurality of shallow trench isolations (STI) 302 are formed in the substrate 300.

Figure 2:
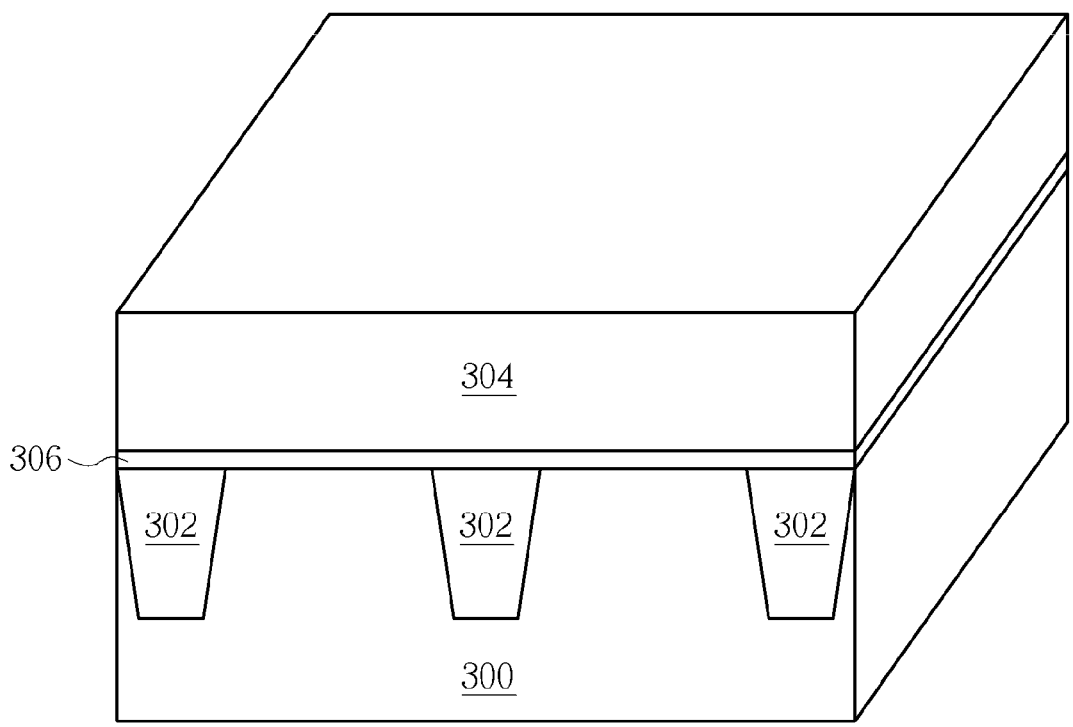

As shown in FIG. 2, an optional dielectric layer 306 and a poly-silicon layer 304 are formed blanketly on the substrate 300. The method for forming the dielectric layer 306 and the poly-silicon layer 304 may be a chemical vapor deposition (CVD) process, but is not limited thereto. In one embodiment, the dielectric layer 306 may be a low dielectric layer such as silicon dioxide ($SiO_2$) or silicon nitride, or a high-k dielectric layer such as hafnium oxide ($HfO_2$), hafnium silicon oxide ($HfSiO_4$) or hafnium silicon oxynitride (HfSiON), but is not limited thereto.

Figure 3:
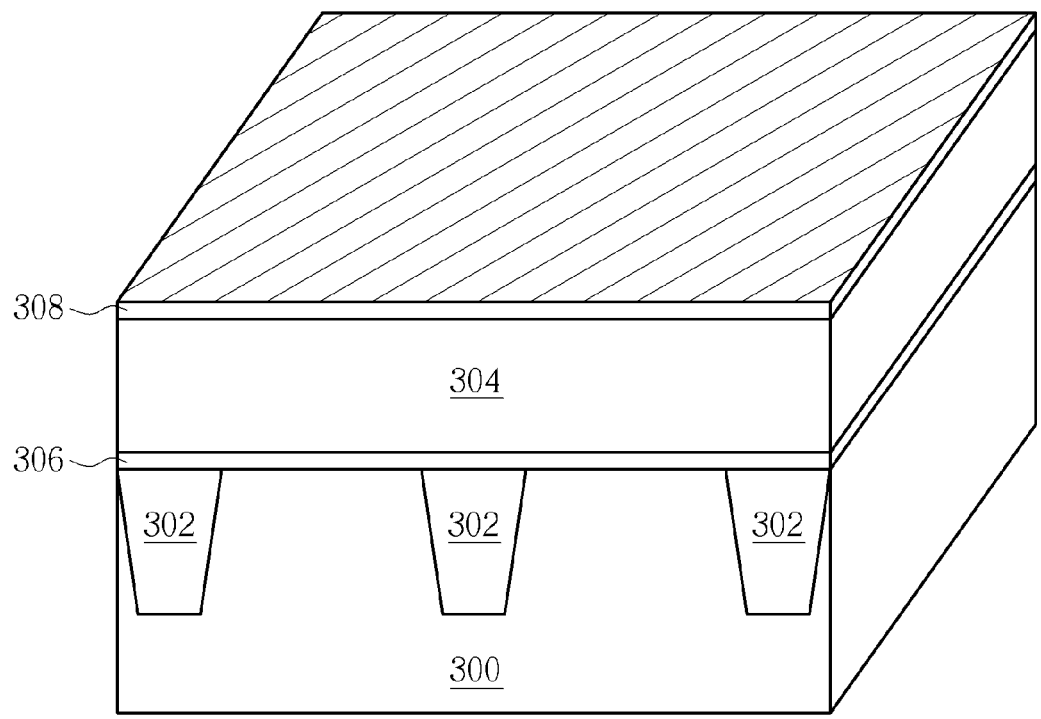

As shown in FIG. 3, an ultra-thin silicon oxide layer 308 is formed on the poly-silicon layer 308. In one preferred embodiment, the silicon oxide layer 308 has a thickness substantially less than 50 angstroms (Å), such as 10 to 20 angstroms. In one embodiment, the method for forming the silicon oxide layer 308 includes an oxygen ambience treatment or a deposition process. The oxygen ambience treatment may include an annealing process, a plasma treatment process or a chemical treatment process. In one preferred embodiment, the annealing process includes supplying gas containing $O_2$ under 300° C. to 500° C., preferably 100% $O_2$ gas under 400° C. Plasma treatment process includes using plasma containing $O_2$. Chemical treatment includes using a chemical solvent containing $NH_4OH$, $H_2O_2$ and $H_2O$, such as $SC_1$ solvent. In another embodiment, the deposition process may be a CVD process or an atomic layer deposition (ALD) process, but is not limited thereto.

Figure 4:
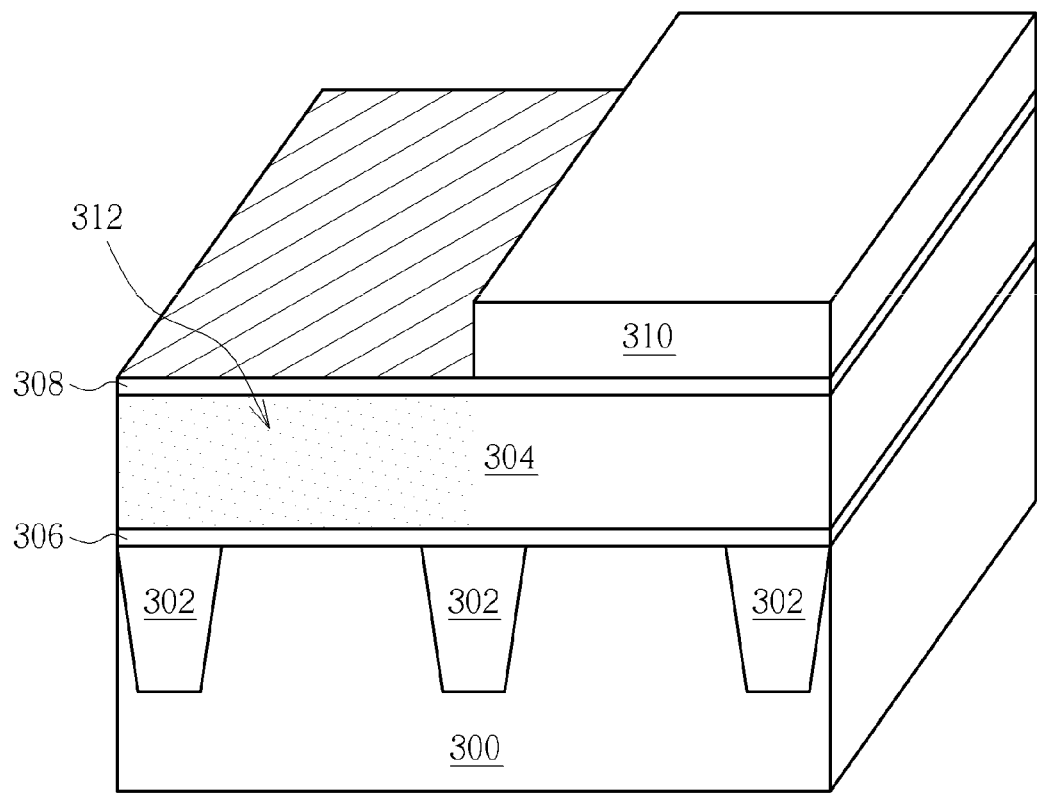

As shown in FIG. 4, a first doping region 312 is formed in a part of the poly-silicon layer 304. For example, a first patterned photoresist layer 310 is formed on the poly-silicon layer 304 to cover a part of the poly-silicon layer 304 and the silicon oxide layer 308. In one preferred embodiment of the present invention, a sidewall of the first patterned photoresist layer 310 is above and substantially corresponding to the STI 302. An ion implantation process is performed by using the first patterned photoresist layer 310 as a mask, followed by the removal the first patterned photoresist layer 310 and an optional annealing process to activate the first doping region 312. A first doping region 312 is therefore formed in the poly-silicon layer 304 not covered by the first patterned photoresist layer 310. Preferably, all the poly-silicon layer 304 not covered by the first patterned photoresist layer 310 become the first doping region 312. Alternatively, the area of the first doping region 312 can be adjusted depending on different designs of the products. For example, only a portion of the poly-silicon layer 304 becomes the first doping region 312. The first doping region 312 has a first conductivity type dopant, for instance, an N-type dopant such as phosphorus.

Figure 5:
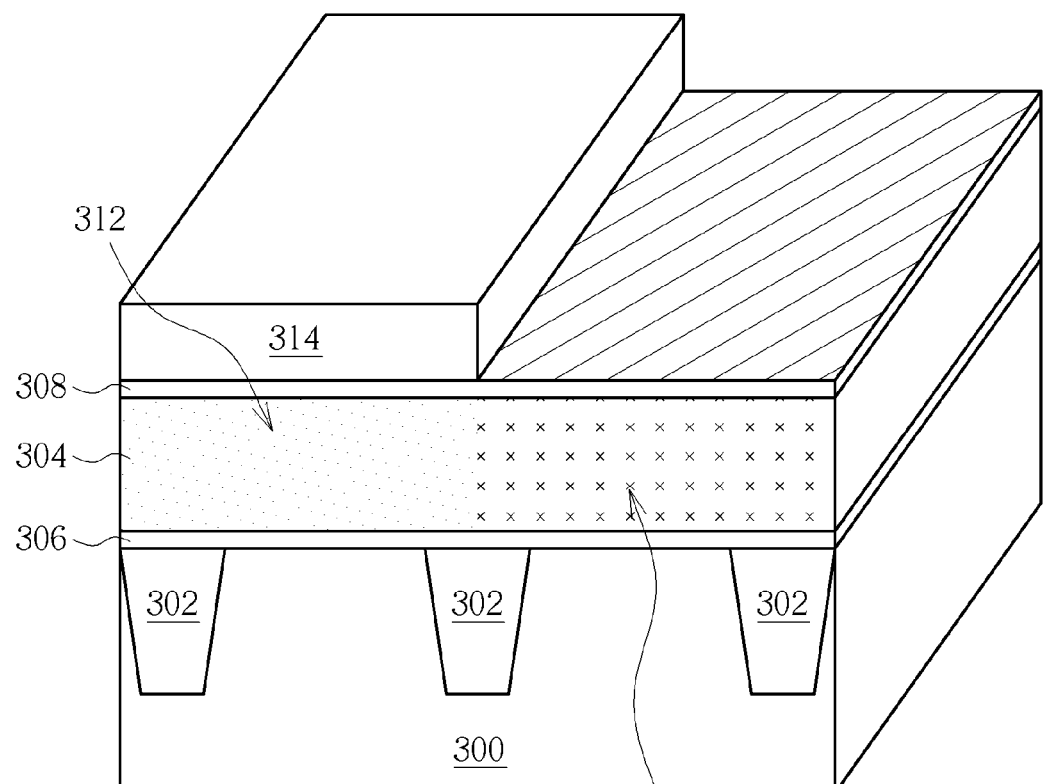

As shown in FIG. 5, a second doping region 316 is formed in the poly-silicon layer 304. Preferably, the second doping region 316 does not overlap the first doping region 312, that is, the second doping region 316 is formed in the region of poly-silicon layer 304 other than the first doping region 312. In another embodiment, there may be other un-doped regions other than the first doping region 312 and the second doping region 316. The method of forming the second doping region 316, for example, includes forming a second patterned photoresist layer 314 which is disposed above the first doping region 312. An ion implantation process is performed by using the second patterned photoresist layer 314 as a mask, followed by the removal of the second patterned photoresist layer 314 and an optional annealing process. A second doping region 312 is therefore formed in the poly-silicon layer 304 not covered by the second patterned photoresist layer 314. Preferably, all the poly-silicon layer 304 not covered by the second patterned photoresist layer 314 become the second doping region 316. In one embodiment, the second doping region 316 has a second conductivity type dopant, for instance, a P-type dopant such as boron. In one embodiment, the annealing step for the first doping region 312 can be omitted and only one annealing step is performed to simultaneously activate the first doping region 312 and the second doping region 316.

It is one salient feature that an ultra-thin silicon oxide layer 308 is formed on the poly-silicon layer 304 before the formation of the first doping region 312 or the second doping region 316. A reaction shown below therefore takes place at the interface between the ultra-thin silicon oxide layer 308 and the below poly-silicon layer 304:

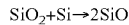

$$SiO_2+Si \rightarrow 2SiO$$

This reaction will increase the effect of "vacancy diffusion" in the poly-silicon layer 304 and also reduces the effect of "interstitial diffusion". Because the phosphorus in the first doping region 312 or the boron in the second doping region 316 mainly diffuses by the mechanism of interstitial diffusion, by using the silicon oxide layer 308 formed on the poly-silicon layer 304 in the present invention, the "lateral diffusion" phenomenon of the first doping region 312 or the second doping region 316 can be therefore reduced. Accordingly, the dopant in the first doping region 312 and the dopant in the second doping region 316 will not migrate and mix to each other. Furthermore, in another embodiment, the layout of the first patterned photoresist layer 310 and the second patterned photoresist layer 314 can be adjusted to form an un-doped region disposed between the first doping region 312 and the second doping region 316 so that the first doping region 312 and the second doping region 316 do not directly contact each other. The present embodiment can more effectively avoid the lateral diffusion phenomenon by combining the adjustment of the layout of the photoresist layer and the forming of the silicon oxide layer 308.

Figure 6:
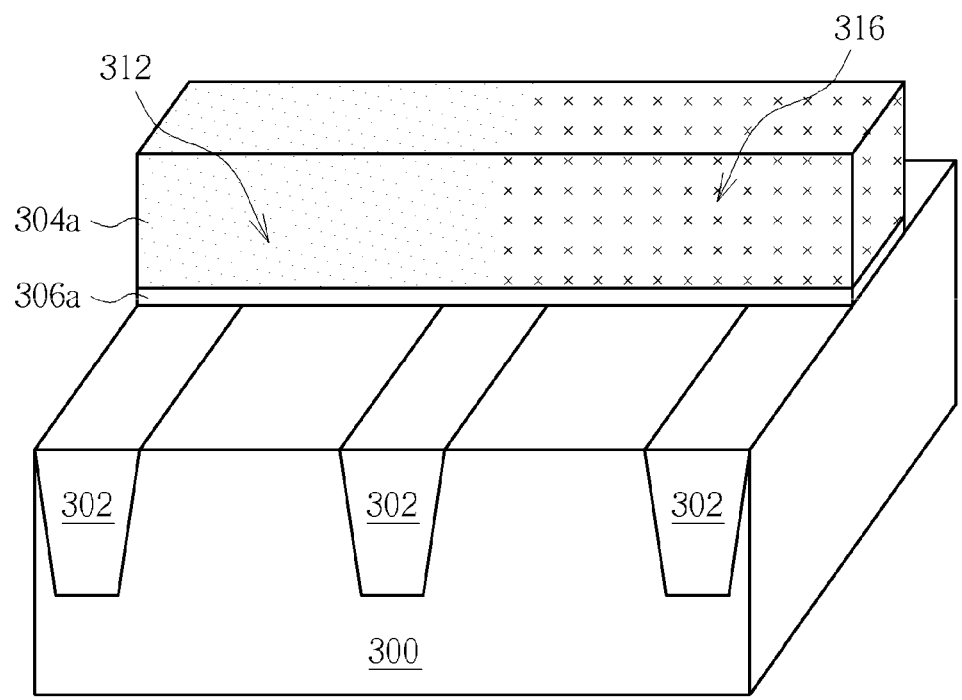
Figure 7:
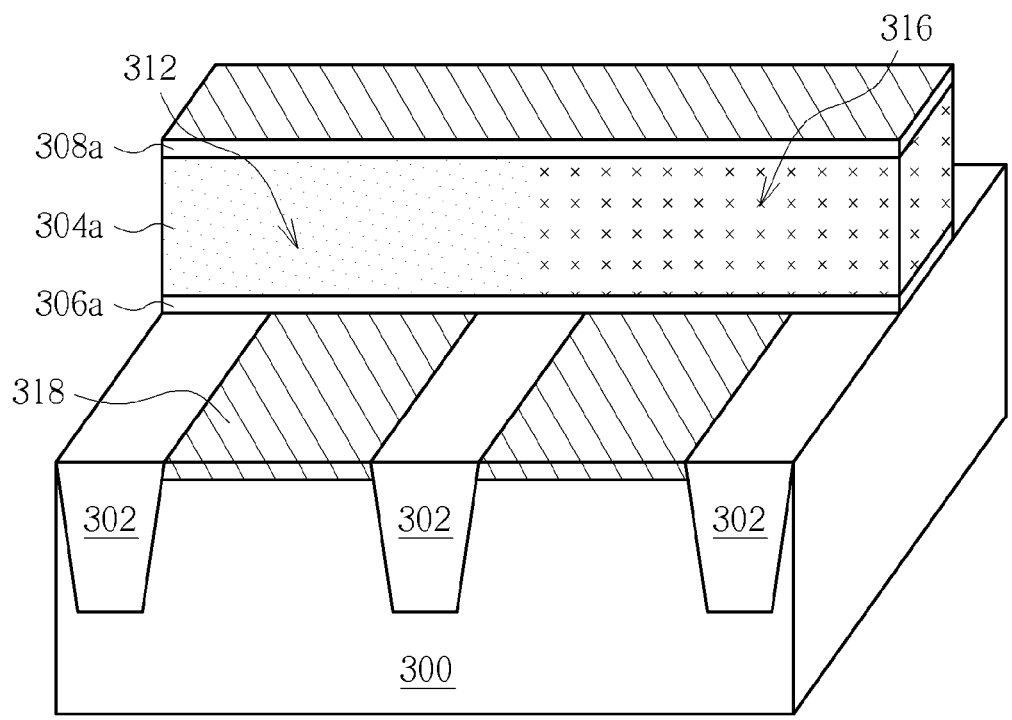

As shown in FIG. 6, the poly-silicon layer 304, the dielectric layer 306 and the silicon oxide layer 308 are patterned to form a patterned poly-silicon layer 304a, a patterned dielectric layer 306a and a patterned silicon oxide layer 308a. In one embodiment, the patterned dielectric layer 306a can be used as a gate dielectric layer, while the patterned poly-silicon layer 304a can be used as a gate electrode, in which the portion of the first doping region 312 is a gate of an NMOS and the portion of the second doping region 316 is a gate of a PMOS. In the subsequent steps, a source/drain region, a spacer, an LDD region or a silicide layer (not shown in FIG. 6) can be formed so as to complete a CMOS. In one preferred embodiment of the present invention, the patterned silicon oxide layer 308a will not be removed but maintained on the patterned poly-silicon layer 304a, so as to effectively suppressing the lateral diffusion. In another embodiment, the patterned silicon oxide layer 308a is removed.

In addition to the embodiment which is applied to poly-silicon layer, the present invention which uses the silicon oxide layer to effectively suppress lateral diffusion can also be applied to other silicon containing layer such as mono-silicon layer, amorphous silicon layer or epitaxial silicon layer. For example, in one embodiment of the present invention, the step of forming of the source/drain region and/or the LDD can also include forming an ultra-thin silicon oxide layer on the substrate. Please continue to refer to FIG. 7. An ultra-thin silicon oxide layer 318 is formed in the substrate 300 at two sides of the patterned poly-silicon layer 304a. In one embodiment, the silicon oxide layer 318 can be formed simultaneously formed on the sidewall of the patterned poly-silicon layer 304a. Preferably, the silicon oxide layer 318 has a thickness substantially less than 50 angstroms (Å), such as 10 to 20 angstroms. The method for forming the silicon oxide layer 318 includes an oxygen ambience treatment or a deposition process. The oxygen ambience treatment may include an annealing process, a plasma treatment process or a chemical treatment process. In one preferred embodiment, the annealing process includes supplying gas containing $O_2$ under 300° C. to 500° C., preferably 100% $O_2$ gas under 400° C. Plasma treatment process includes using plasma containing $O_2$. Chemical treatment includes using a chemical solvent containing $NH_4OH$, $H_2O_2$ and $H_2O$, such as $SC_1$ solvent. In another embodiment, the deposition process may be a CVD process or an atomic layer deposition (ALD) process, but is not limited thereto.

Figure 8:
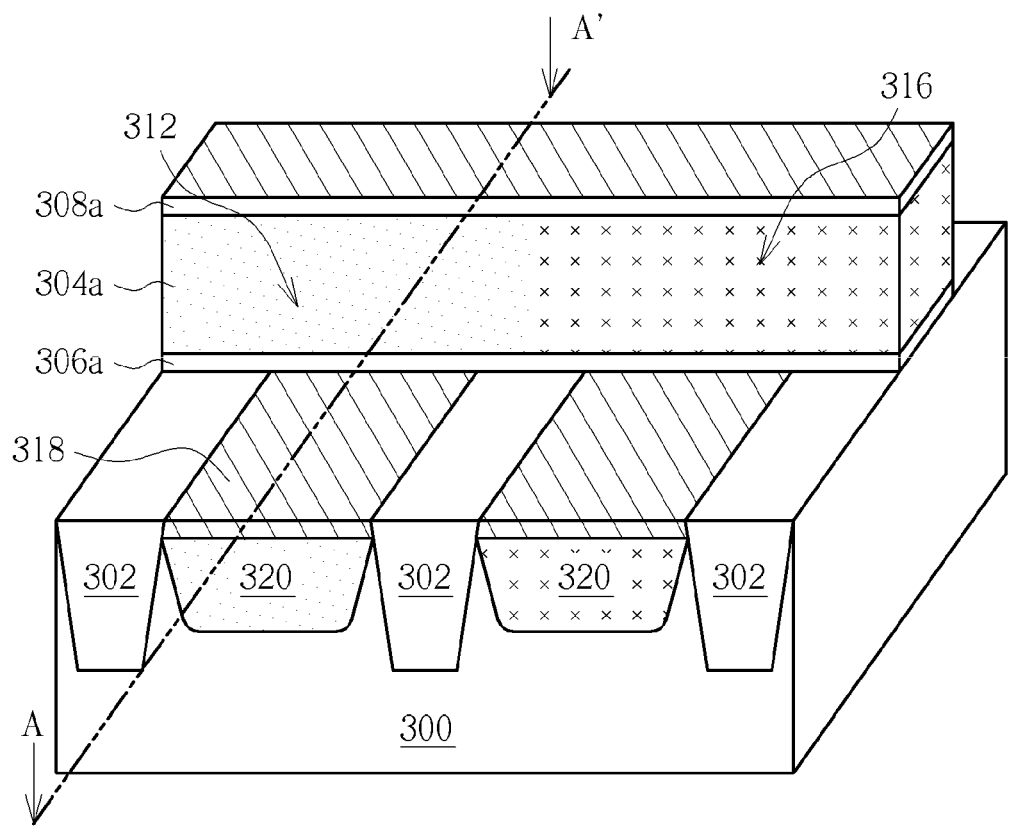
Figure 9:
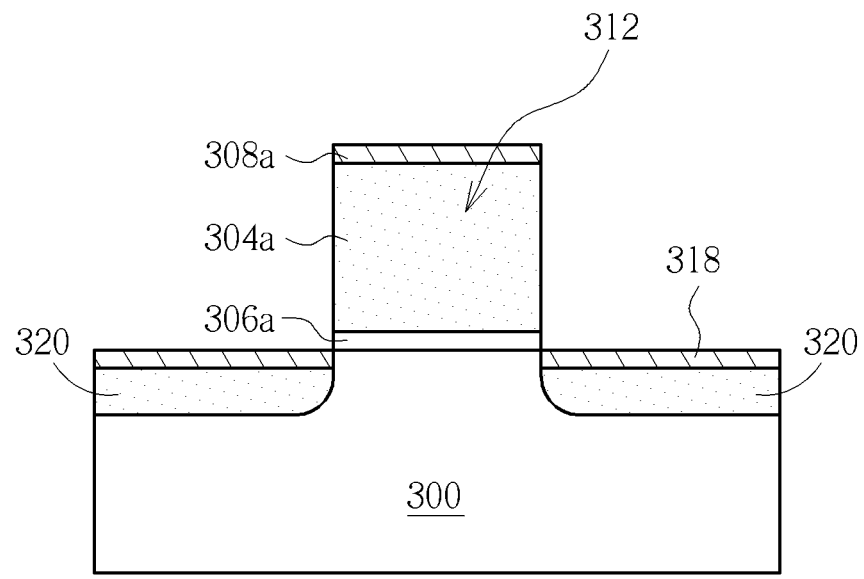
Figure 10:
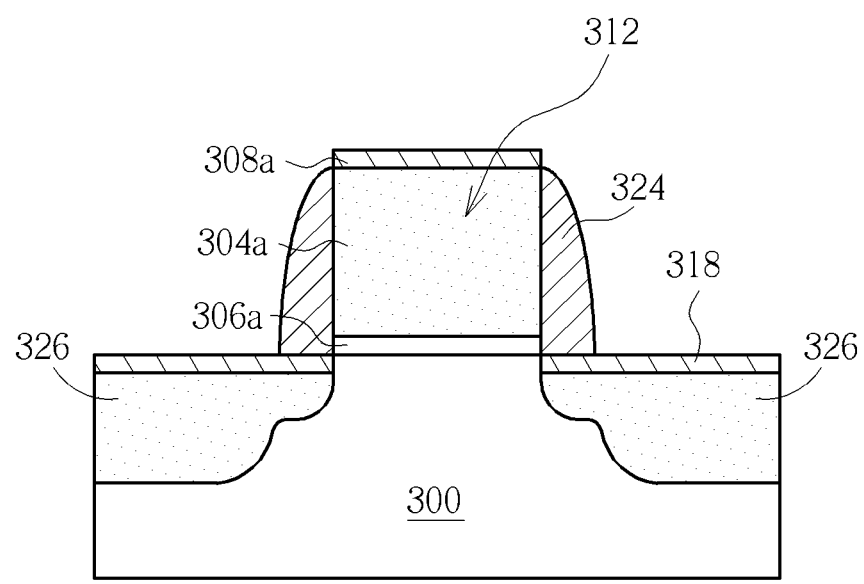
Figure 11:
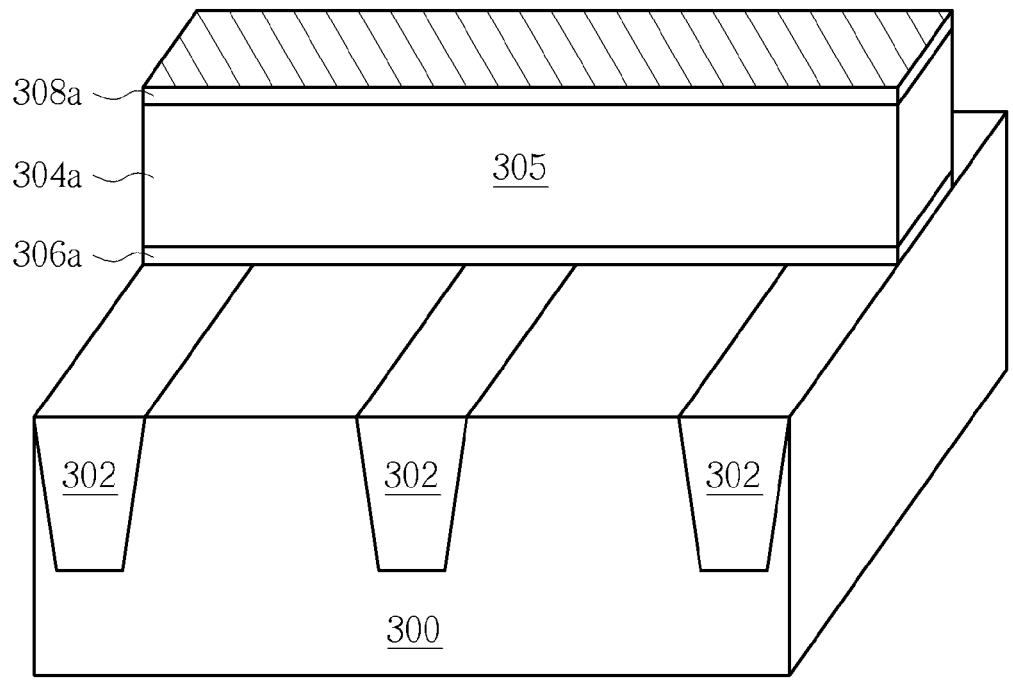
FIG. 11 is a schematic diagram of the method for forming a doping region according to another embodiment of the present invention.

As shown in FIG. 8, suitable doping regions such as LDD 320 and LDD 322 are formed in the substrate 300 under the silicon oxide layer 318 and at two sides of the patterned poly-silicon layer 304a. The LDD 320 and the first doping region 312 have the same conductivity type dopant such as an N-type dopant. The LDD 322 and the second doping region 316 have the same conductivity type dopant such as a P-type dopant. Please refer to FIG. 9, which shows a cross-sectional view taken along line AA' in FIG. 8. Since the silicon oxide layer 318 is formed on the LDD 320, the lateral diffusion of the LDD 320 into the channel under the patterned dielectric layer 306a can be avoided so the performance of the NMOS can be improved. Similarly, since the silicon oxide layer 318 is formed on the LDD 322, the lateral diffusion of the LDD 322 into the channel under the patterned dielectric layer 306a can be avoided so the performance of the PMOS can be improved As shown in FIG. 10, a spacer 324 can be formed on the sidewall of the patterned poly-silicon layer 304a, following by using the spacer 324 and the patterned silicon oxide layer 308a as a mask to form a source/drain region 326 in the substrate 300. Since the silicon oxide layer 318 is formed on the source/drain region 326, the lateral diffusion of the source/drain region 326 can be avoided so the performance of the NMOS can be improved Please refer to FIG. 11, which is a schematic diagram of the method for forming a doping region according to another embodiment of the present invention. The front steps in the present invention are similarly to the first embodiment in FIG. 1 and FIG. 3. After the step in FIG. 3, as shown in FIG. 11, the poly-silicon layer 304, the dielectric layer 306 and the silicon oxide layer 308 are patterned to form a patterned poly-silicon layer 304a, a patterned dielectric layer 306a and a patterned silicon oxide layer 308a. Next, the first doping region 312 and the second doping region 316 are respectively formed in the patterned poly-silicon layer 304a, thereby forming the structure in FIG. 6. Subsequently, the steps in FIG. 7 to FIG. 10 are carried out. In the present embodiment, the first doping region 312 and the LDD 320 can be formed simultaneously, and the second doping region 316 and the LDD 322 can be formed simultaneously. In another embodiment of the present invention, the step of forming the second doping region 316 in the poly-silicon layer 304 can be omitted, or the step of forming the first doping region 312 in the poly-silicon layer 304 can be omitted. Preferably, the step of forming the doping region which contains P-type conductive dopant is omitted.

Figure 12:
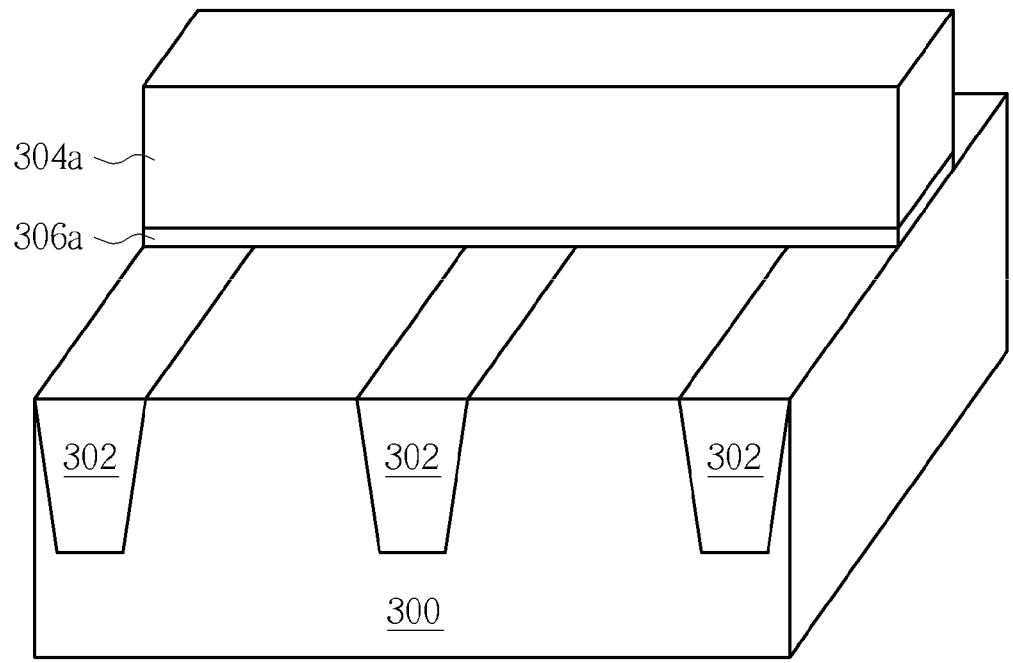
FIG. 12 is a schematic diagram of the method for forming a doping region according to another embodiment of the present invention.

Please refer to FIG. 12, which is a schematic diagram of the method for forming a doping region according to another embodiment of the present invention. The front steps in the present invention are similarly to the first embodiment in FIG. 1 and FIG. 2. After the step in FIG. 2, as shown in FIG. 12, the poly-silicon layer 304, the dielectric layer 306 are patterned to form a patterned poly-silicon layer 304a and the patterned dielectric layer 306a. Next, the silicon oxide layer 308 is formed on the patterned poly-silicon layer 304a, thereby forming the structure in FIG. 11. Subsequently, the steps in FIG. 6 to FIG. 10 are carried out. In the present embodiment, the silicon oxide layer 308 on the patterned poly-silicon layer 304a and the silicon oxide layer 318 on the substrate 300 can be formed simultaneously. The first doping region 312 and the LDD 320 can be formed simultaneously, and the second doping region 316 and the LDD 322 can be formed simultaneously. Similarly, one of the step of forming the second doping region 316 in the poly-silicon layer 304 and the step of forming the first doping region 312 in the poly-silicon layer 304 can be omitted.

It is one feature of the present invention that an ultra-thin silicon oxide layer is formed on the silicon-containing layer, followed by forming a doping region directly under the silicon oxide layer. It is found that the interstitial diffusion, especially the lateral diffusion, can be suppressed. In principle, the present invention is preferable applied to a poly-silicon layer, however, is may be also applied to mono-silicon, amorphous silicon or epitaxial silicon. Overall, the present invention can be applied to any silicon-containing layer. For example, the source/drain region can include the structure which is formed by a selective epitaxial growth (SEG) process. Alternatively, the present invention for forming the doping region can be applied to the source/drain region in a fin structure of a non-planar transistor. Alternatively, the present invention can also be applied in forming a PN junction in an epitaxial layer or a silicon substrate of a photo sensitive transistor.

In summary, the present invention provides a method for forming a doping region in a silicon containing layer, especially a poly-silicon layer to avoid the lateral diffusion of the doping region. The performance of the devices can therefore be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a doping region, comprising:
providing a substrate;
forming a poly-silicon layer on the substrate;
performing a chemical treatment process to form a silicon oxide layer only on a top surface of the poly-silicon layer, wherein the chemical treatment process uses a chemical solvent containing $NH_4OH$, $H_2O_2$, and $H_7O$; and
performing an implant process to form a doping region in the poly-silicon layer under the silicon oxide layer.

2. The method for forming the doping region as in claim 1, wherein the silicon oxide layer is formed before performing the implant process.

3. The method for forming the doping region as in claim 2, further comprising patterning the poly-silicon layer, to form a patterned poly-silicon layer.

4. The method for forming the doping region as in claim 3, wherein the poly-silicon layer is patterned before forming the silicon oxide layer, and the silicon oxide layer is formed on a top surface of the patterned poly-silicon layer and the doping region is formed in the patterned poly-silicon under the silicon oxide layer.

5. The method for forming the doping region as in claim 3, wherein the poly-silicon layer is patterned after forming the silicon oxide layer, the silicon oxide layer on the top surface of the poly-silicon layer is also patterned, and the implant process is performed in the patterned poly-silicon layer under the patterned silicon oxide layer.

6. The method for forming the doping region as in claim 1, wherein the silicon oxide layer has a thickness substantially less than 50 angstroms.

7. The method for forming the doping region as in claim 1, wherein the doping region is used as a gate of a MOS.

8. A method for forming a metal oxide semiconductor (MOS), comprising:
providing a substrate;
forming a poly-silicon layer on the substrate;
forming a first silicon oxide layer on the poly-silicon layer;
after forming the first silicon oxide layer, patterning the first silicon oxide layer and the poly-silicon layer under the first silicon oxide layer;
forming a doping region in the patterned poly-silicon layer under the patterned first silicon oxide layer;
forming a second silicon oxide layer in the substrate at two sides of the patterned poly-silicon layer; and
after forming the second silicon oxide layer, forming a source/drain region in the substrate under the second silicon oxide layer.

9. The method for forming the MOS as in claim 8, wherein the first silicon oxide layer and the second silicon oxide layer have a thickness substantially less than 50 angstroms.

10. The method for forming the MOS as in claim 8, wherein the doping region has an N-type dopant.

* * * * *